US009900984B2

United States Patent
Ho et al.

(10) Patent No.: US 9,900,984 B2
(45) Date of Patent: Feb. 20, 2018

(54) AUXILIARY MOUNTING STRUCTURE FOR MOUNTING ADVANCED SMART CARD

(71) Applicant: Taisys Technologies Co., Ltd., Taipei (TW)

(72) Inventors: Chun Hsin Ho, Taipei (TW); Sheng Hsiang Wang, New Taipei (TW); I Chen Hung, Taoyuan (TW)

(73) Assignee: Taisys Technologies Co. Ltd., Taipei (TW)

( * ) Notice: Subject to any disclaimer, the term of this patent is extended or adjusted under 35 U.S.C. 154(b) by 94 days.

(21) Appl. No.: 14/985,510

(22) Filed: Dec. 31, 2015

(65) Prior Publication Data

US 2017/0196088 A1    Jul. 6, 2017

(51) Int. Cl.

| H05K 1/14 | (2006.01) |
| H04B 1/38 | (2015.01) |
| G06K 19/07 | (2006.01) |
| H04B 1/3816 | (2015.01) |

(52) U.S. Cl.
CPC .......... *H05K 1/144* (2013.01); *H04B 1/3816* (2013.01)

(58) Field of Classification Search
CPC . H05K 1/144; H04B 1/3816; G06K 19/07739
See application file for complete search history.

(56) References Cited

U.S. PATENT DOCUMENTS

| 7,922,097 | B2 * | 4/2011 | Yoshikawa | .......... G06K 19/077 235/492 |
| 8,644,025 | B2 * | 2/2014 | Luo | ........................ G06K 19/07 361/715 |
| 8,950,681 | B2 * | 2/2015 | Lepp | .................... G06K 19/077 235/492 |
| 9,165,237 | B2 * | 10/2015 | Scarlatella | ....... G06K 19/07739 |
| 2005/0231921 | A1 * | 10/2005 | Noda | .................... G06K 7/0021 361/737 |
| 2007/0262156 | A1 * | 11/2007 | Chen | .................... H04B 1/3816 235/492 |
| 2016/0307090 | A1 * | 10/2016 | Ho | .................... G06K 19/07743 |
| 2017/0132506 | A1 * | 5/2017 | Blythe | ............... G06K 19/0772 |
| 2017/0132507 | A1 * | 5/2017 | Blythe | ............... G06K 19/0775 |

FOREIGN PATENT DOCUMENTS

| CN | 203786755 U | * | 8/2014 |
| CN | 203894782 U | * | 10/2014 |
| EP | 2608116 A1 | * | 6/2013 | ............... G06K 1/02 |
| ES | 1100632 U | * | 2/2014 |
| WO | WO 2006084988 A1 | * | 8/2006 | .......... G06K 19/077 |
| WO | WO 2016168965 A1 | * | 10/2016 | ............. G06K 19/07 |

* cited by examiner

*Primary Examiner* — Nathan Milakovich
(74) *Attorney, Agent, or Firm* — Che-Yang Chen; Law Offices of Scott Warmuth

(57) ABSTRACT

An auxiliary mounting structure, for mounting an advanced smart card which has a contact side with a number of smart card contacts, onto a Subscriber Identity Module (SIM) card is disclosed. The auxiliary mounting structure is formed by a board and has several key parts. With the help of the auxiliary mounting structure, the advanced smart card can be easily attached to the SIM card without aligning contacts.

11 Claims, 14 Drawing Sheets

AUXILIARY MOUNTING STRUCTURE FOR MOUNTING ADVANCED SMART CARD

FIELD OF THE INVENTION

The present invention relates to an auxiliary mounting structure. More particularly, the present invention relates to an auxiliary mounting structure for mounting an advanced smart card.

BACKGROUND OF THE INVENTION

Generally, there are many types of telecommunication networks, which have been established for providing a variety of services to network subscribers. Certainly, the widely used and well-known service provided by telecommunication networks is mobile phone services, such as with cellular telephones. Meanwhile, several surface contacting cards with special circuits are widely used in electronic devices to enhance the functions of the electronic devices for providing more services. For example, a subscriber identity module (SIM) card could be placed into a portable phone to dedicate the phone's functions to the SIM card owner. Furthermore, some telecommunication networks provide other services that involve banking operations and transaction functions. However, the compact SIM card merely includes basic information of owner for providing a variety of services to network subscribers. When services of banking operations and transaction functions are provided, there should be a lot of data transmission between telecommunication networks because the compact SIM in the portable phone could not provide further information.

Moreover, IC cards are used in numerous applications such as payment at a point of sale (known as "bank cards"), public telephones, payment for parking, payment for tolls, mobile telephones (e.g., SIM cards), public transportation, or electronic purse. Each of these applications is associated with a specific card: a bank card, a phone card, a parking card, a SIM card for GSM telephony, and so on.

In practice, the problems ensuing from stolen and forged credit cards and cash cards are becoming more and more serious, and increased efforts are made to reduce the risks involved in this respect. Many solutions have been proposed, including time limits, limited withdrawals, duplicate encryption, and the identification of the card owner with all manner of means ranging from PIN codes to fingerprints, one-time passwords, etc. Regardless of the solutions applied, a fraudulent person is able to pass through the different barriers and obstacles with the aid of ever more sophisticated methods.

Furthermore, the use of mobile telephones or electronic wallets has also been a means of payment, and an increasing number of payments in greater sums will at times be made in electronic cash. False/cloned telephones and SIM cards already exist, and the use of telephones and SIM cards in respect of payments will increase the above-identified risks still more.

One of the problems encountered in daily use of such a variety of smart cards lies in that one of the cards might not be available when it is to be used, no matter whether it is left at home, its credit has been run out, or it has expired. In addition, administration and carry of various smart cards is inconvenient. Therefore, there is a strong need for the so-called "multi-application cards".

Nowadays, a trend is obvious is that functions of the smart cards may be integrated into one SIM card or worked via an intermedia device. For the latter, a contactless transaction adaptor disclosed in U.S. Pat. No. 8,424,757 is an example. Such kind of devices usually is in form of a laminated smart card interface and has two sides of contacts. One side is for connecting with a SIM card while the other side linked to the SIM card slot. Therefore, when a mobile phone is communicating with the SIM card, additional functions can be provided by the device through the SIM card slot along with the message from the SIM card. However, the contacts of the SIM card and the device are tiny and arranged closely. It is not easy for users to install the SIM card onto the device with corresponding contacts matched. This mismatch of contacts will lead circuit short, further causing the SIM card non-working. Hence, an auxiliary mounting structure used for mounting the smart card on to the SIM card easily is desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to fulfill the requirements above, an auxiliary mounting structure is provided. The auxiliary mounting structure is formed by a board, for mounting an advanced smart card which has a contact side with a plurality of smart card contacts, onto a Subscriber Identity Module (SIM) card, including: a first accommodating portion, including: a first removed region, having a shape substantially equal to that of a first type SIM card; and a second removed region, formed below the first removed region and penetrating the board, having a shape substantially equal to that of a second type SIM card; a second accommodating portion, including: a third removed region, having a shape substantially equal to that of the second type SIM card, for placing the advanced smart card; and a fourth removed region, formed below the third removed region and penetrating the board, having a shape substantially equal to that of a third type SIM card; a plastic film, glued on a gluing side, attached underneath the first removed region, for removably attaching the advanced smart card when the advanced smart card being placed in the second removed region; and a sandpaper, installed on the board, for rubbing down partial thickness of the SIM card attached to the advanced smart card. A shape of the advanced smart card is substantially the same as that of the second type SIM card.

According to the present invention, the board may be made of cardboards, plastic, carbon fiber, or metal. The second accommodating portion may be included in a cut-off body having a shape substantially equal to that of a first type SIM card, capable of being removed from the auxiliary mounting structure. The first type SIM card is a mini-SIM card (2FF). The second type SIM card is a micro-SIM card (3FF). The third type SIM card is a nano-SIM card (4FF). The plastic film may be made by Poly Ethylene (PE), Poly Vinyl Chloride (PVC) or Poly Ethylene Terephthalate (PET).

Preferably, the advanced smart card has a flexible printed circuit board having the smart card contacts on the contact side and an integrated circuit. The advanced smart card has a layer of glue around the smart card contacts and covered by a release paper. The portion where the plastic film is exposed out of the second removed region is covered by a release paper. The board has a tear line so that when the auxiliary mounting structure is torn along the tear line, the sandpaper is separated from the auxiliary mounting structure.

With the help of the auxiliary mounting structure, the advanced smart card can be easily attached to the SIM card without aligning contacts.

DETAILED DESCRIPTION OF THE PREFERRED EMBODIMENTS

The present invention will now be described more specifically with reference to the following embodiments.

Figure 1:
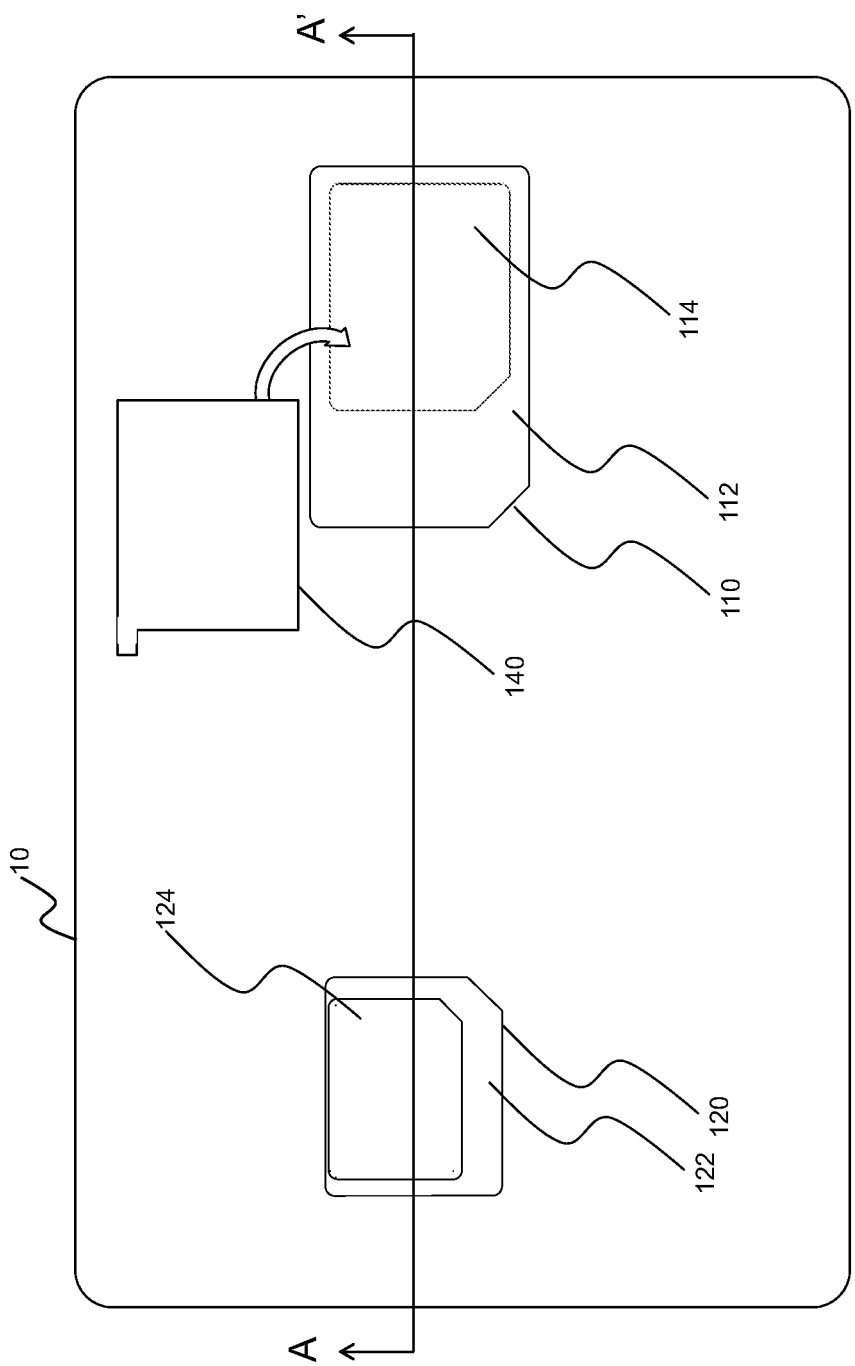
FIG. 1 is a top view of an auxiliary mounting structure according to the present invention.
Figure 2:
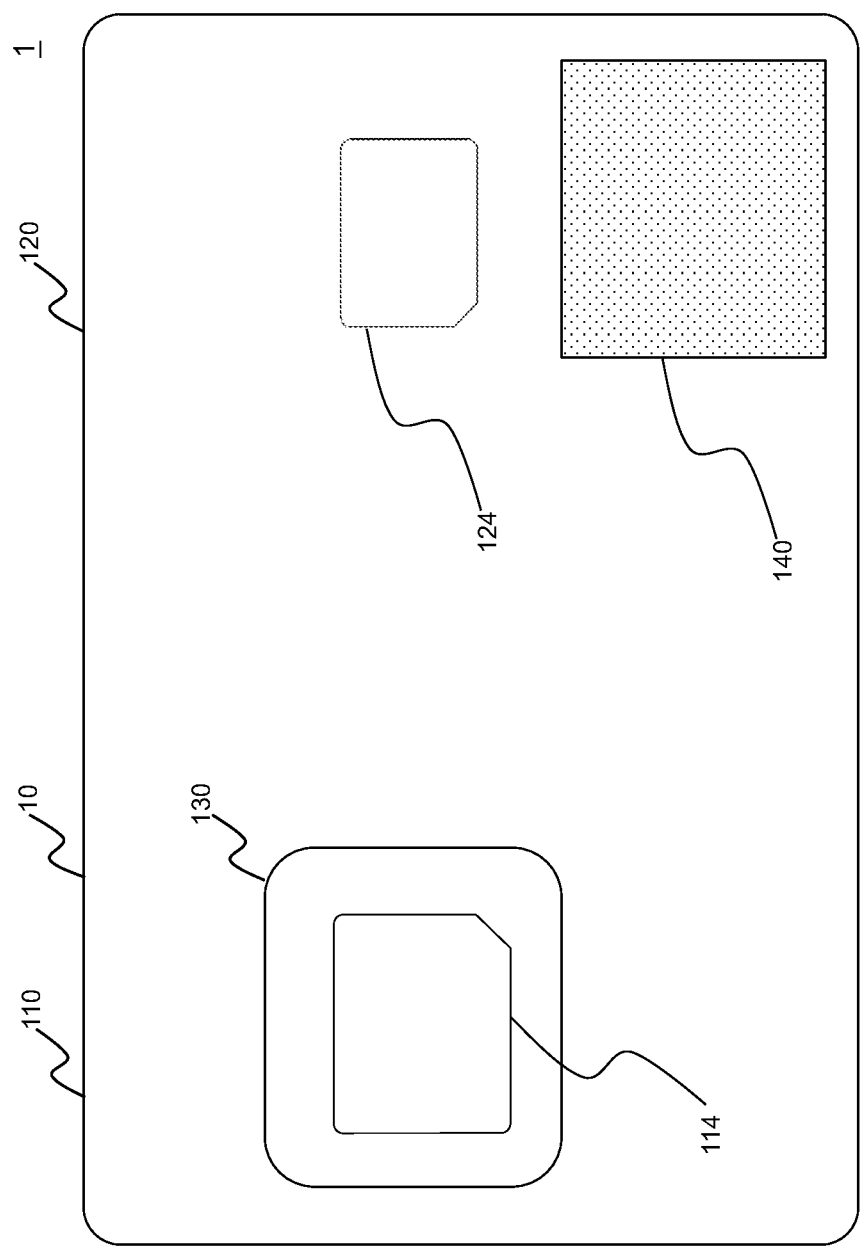
FIG. 2 is a bottom view of the auxiliary mounting structure.
Figure 3:
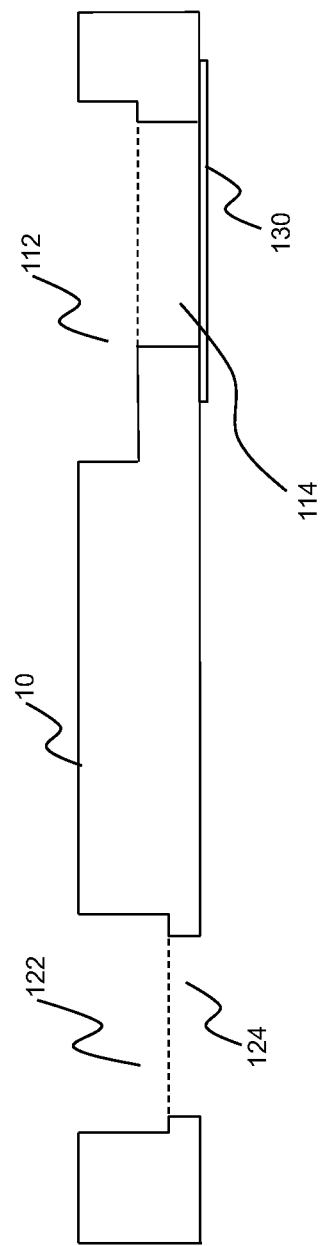
FIG. 3 is a cross-sectional view of the auxiliary mounting structure along a line AA' in FIG. 1.
Figure 4:
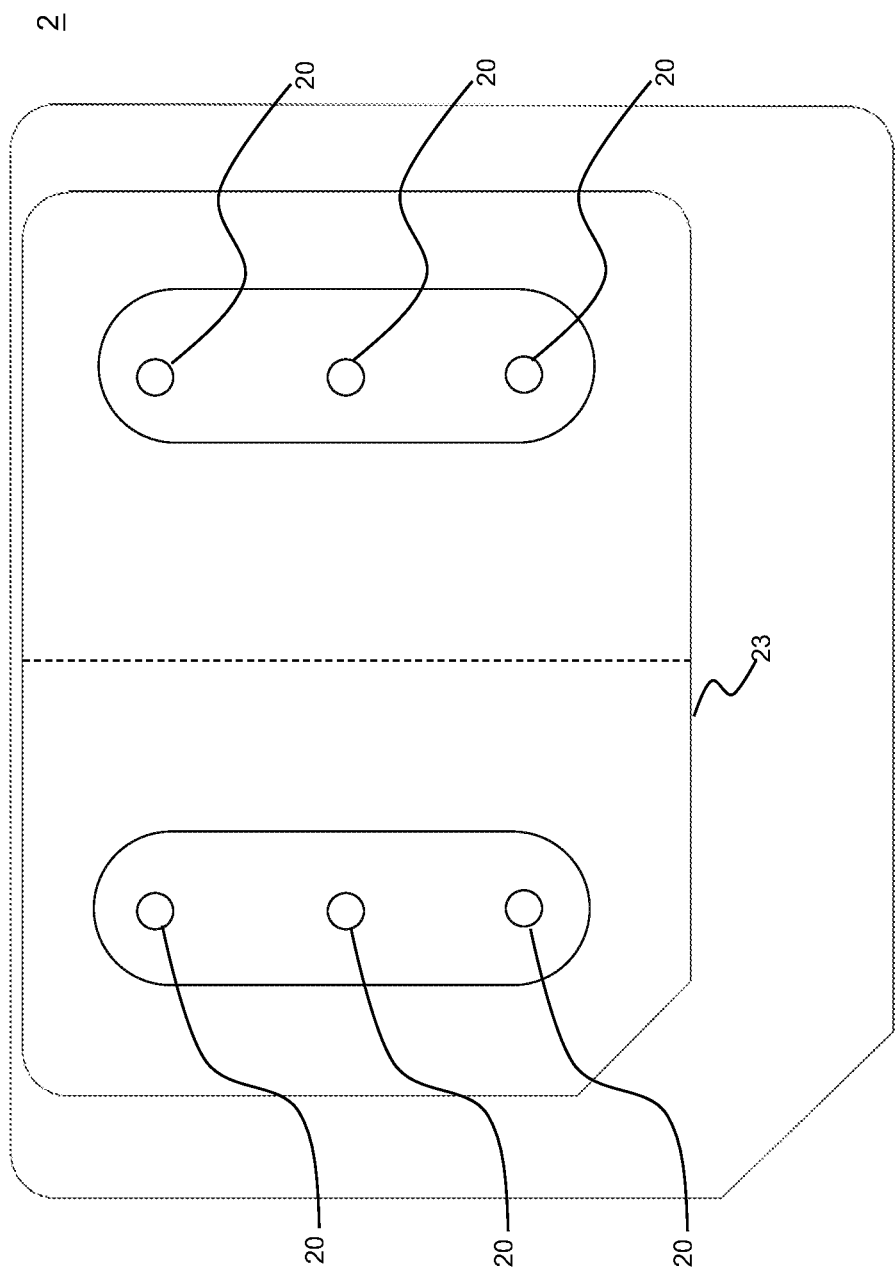
FIG. 4 is a top view of an advanced smart card.

Please see FIG. 1 to FIG. 12. An embodiment of the present invention is disclosed. FIG. 1 is a top view of an auxiliary mounting structure 1 board 10. FIG. 2 is a bottom view of the auxiliary mounting structure 1. The auxiliary mounting structure 1 is used to mount an advanced smart card 2 (please see FIG. 4) onto a Subscriber Identity Module (SIM). The advanced smart card 2 has a contact side (as depicted by FIG. 4) with a number of smart card contacts 20. Each smart card contact 20 connects to a corresponding SIM card contact. The auxiliary mounting structure 1 is formed by a board 10. The board 10 has a shape approximate to a rectangle. In this embodiment, the board 10 is the same as the shape of a full-size SIM card (1FF).

Figure 5:
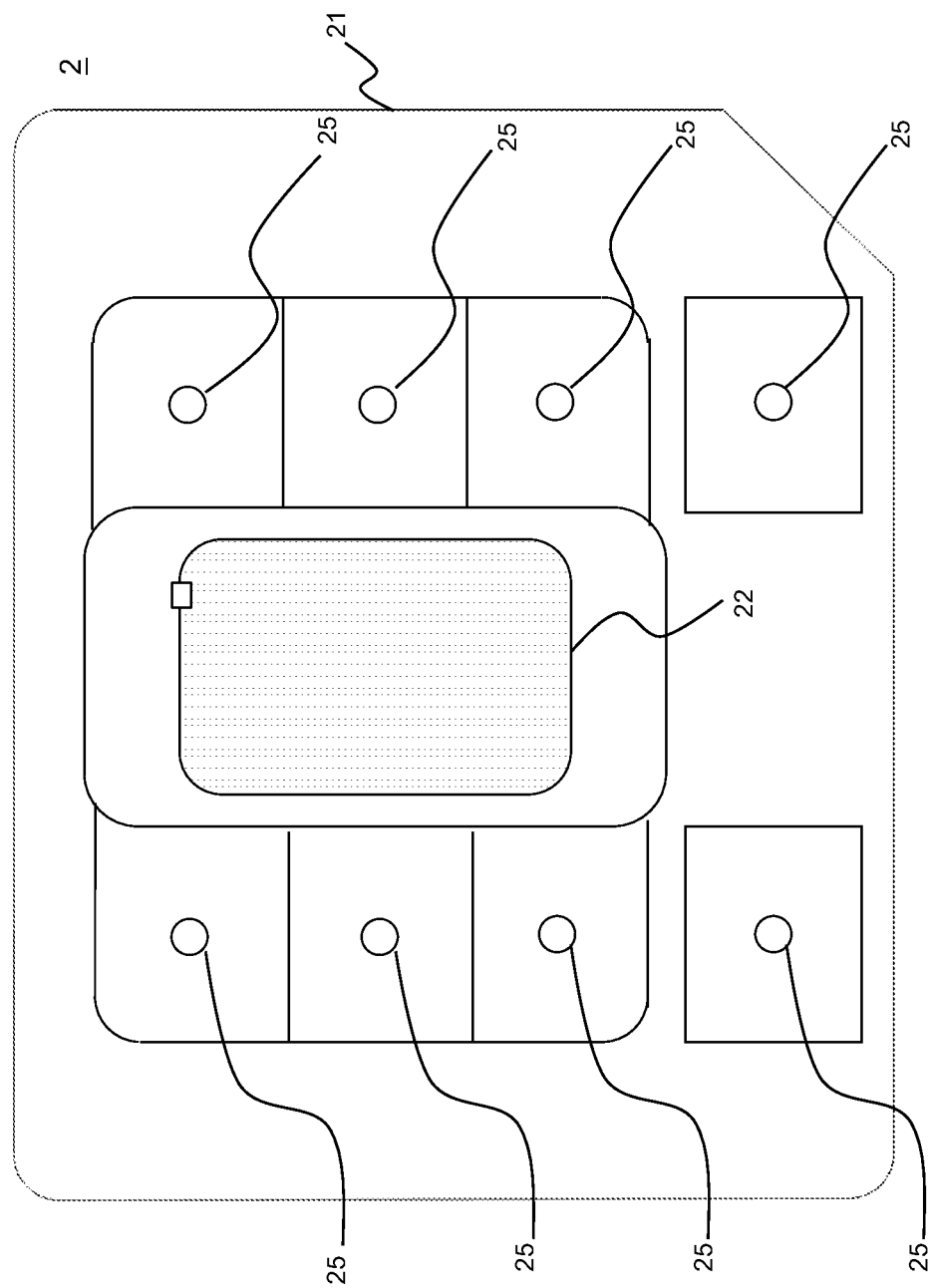
FIG. 5 is a bottom view of an advanced smart card.

Before introducing the details of the auxiliary mounting structure 1, the advanced smart card 2 should be described first. The advanced smart card 2 basically includes a flexible printed circuit board 21 with the smart card contacts 20 on the contact side and an integrated circuit 22 mounted on the other side (as depicted by FIG. 5. In practice, it can be on the same side with the smart card contacts 20). It has a layer of glue (not shown) around the smart card contacts 22 and covered by a release paper 23. On that side, outside the area covered by the release paper 23, there is still glue on the advanced smart card 2. This is for attaching the advanced smart card 2 on the auxiliary mounting structure 1 with the glued portion. Since the stickiness of the glue can not permanently attach and fix the advanced smart card 2 with the auxiliary mounting structure 1 or the release paper 23, the advanced smart card 2 can be removed from the auxiliary mounting structure 1. The release paper 23 can be removed from the advanced smart card 2. All elements will not be damaged by the glue. There are also several contacts 25 on another side of the advanced smart card 2. The contacts 25 are used to connect the advanced smart card 2 to a SIM card slot, so that the SIM card and the integrated circuit 22 can communicate with a mobile phone through the contacts 25. A shape of the advanced smart card 2 is substantially the same as that of the second type SIM card. The second type SIM card mentioned here and hereinafter refers to a micro-SIM (3FF) card.

The auxiliary mounting structure 1 has four key elements: a first accommodating portion 110, a second accommodating portion 120, a plastic film 130 and a sandpaper 140. The auxiliary mounting structure 1 is formed by cutting the board 10. In this embodiment, the board 10 is the same as the shape of a full-size SIM card (1FF). In fact, the auxiliary mounting structure 1 may have any shape. It should be noticed that the board 10 is better made of materials such as cardboards, plastic, carbon fiber, or metal. For the materials mentioned above, if the board 10 is made of cardboards, based on the structure illustrated below, several layers of cardboards and cutting processes are required to form the board 10. If the board 10 is made of plastic (nylon is a good material to use), the board 10 can be formed by injection. If the board 10 is made of carbon fiber, the board 10 can be formed by thermoforming. If the board 10 is made of metal, aluminum or aluminum alloy may be a good choice. The board 10 can be formed by stamping or cutting with some/all cut portions removed. Each element is illustrated below.

The first accommodating portion 110 includes a first removed region 112 and a second removed region 114. The first removed region 112 has a shape substantially equal to that of a first type SIM card. The second removed region 114 is formed below the first removed region 112 and penetrates the board 10, having a shape substantially equal to that of a second type SIM card. The first type SIM card mentioned here and hereinafter refers to a mini-SIM (2FF) card. In order to have a better understanding of the first accommodating portion 110, please refer to FIG. 3. FIG. 3 is a cross-sectional view of the auxiliary mounting structure 1 along line AA' in FIG. 1. Because the thickness of the auxiliary mounting structure 1 is much shorter than that of its length, the thickness of the auxiliary mounting structure 1 is enlarged so that it is clear to the readers. However, in fact, the auxiliary mounting structure 1 is much thinner than it is shown in FIG. 3. On the right side of FIG. 3, it is obvious that depth of the first removed region 112 of the auxiliary mounting structure 1 occupies about half of the thickness of the board 10 (upper half). Depth of the second removed region 114 occupies another half of the thickness of the board 10 (lower half). The lower half and the upper half are separated by a dashed line. The location below the removed region 114 is the plastic film 130. Of course, depths of the first removed region 112 and the second removed region 114 are not necessary to be as close as shown in the present embodiment. They may be in a relationship of any ratio, e.g. 2:1. Depths of the first removed region 112 and the second removed region 114 should be deep enough so that when the first type SIM card and the second type SIM card are placed thereto, respectively, they can be fixed by the peripheries of the corresponding removed region. They won't be moved by the shearing force exerting on the SIM card.

The second accommodating portion 120 includes a third removed region 122 and a fourth removed region 124. The third removed region 122 has a shape substantially equal to that of the second type SIM card. It is for placing the advanced smart card 2. The fourth removed region 124 is formed below the third removed region 122 and penetrates the board 10. It has a shape substantially equal to that of a third type SIM card. The third type SIM card mentioned here and hereinafter refers to a nano-SIM (4FF) card. Please see FIG. 3 again. On the left side of FIG. 3, it is obvious that depth of the third removed region 122 of the auxiliary mounting structure 1 is much deeper than that of the fourth removed region 124 (the third removed region 122 and the fourth removed region 124 are separated by a dashed line). This is because the third removed region 122 is mainly used to allocate the advanced smart card 2 while the fourth removed region 124 allocates the smart card contacts 20 and the release paper 23 of the advanced smart card 2.

The plastic film 130 is glued on a gluing side (the side attached to the board 10 in FIG. 3). It is attached underneath the first removed region 112. Of course, if the board 10 is made of cardboards, peripheries of the plastic film 130 can be sandwiched by two adjacent cardboards. It is not like what is shown in FIG. 3 to expose out of the board 10. Function of the plastic film 130 is to removably attach the advanced smart card 2 when the advanced smart card 2 is placed in the second removed region 114. Thus, the advanced smart card 2 can be removed from the plastic film 130 after being combined with any SIM card. No damage due to the glue occurs. In the present embodiment, the plastic film 130 is made of Poly Ethylene (PE). In fact, it can also be made of Poly Vinyl Chloride (PVC) or Poly Ethylene Terephthalate (PET).

The sandpaper 140 is installed on any portion of the board 10. It is best to install the sandpaper 140 on the back side (the same side of the plastic film 130 in FIG. 3) of the board 10. It is used to rub down partial thickness of the SIM card attached to the advanced smart card 2. A shape of the sandpaper 140 is not required to be a triangle as show in FIG. 2. It can be any shape, even a special shape. The sandpaper 140 can be embedded in the board 10; it can also be attached to the board 10. When the sandpaper 140 is used to rub down partial thickness of the SIM card, the sandpaper 140 should be removed from the board 10, or been taken away by destroying the board 10. A detailed illustration of use of the sandpaper 140 will be provided below.

Figure 6:
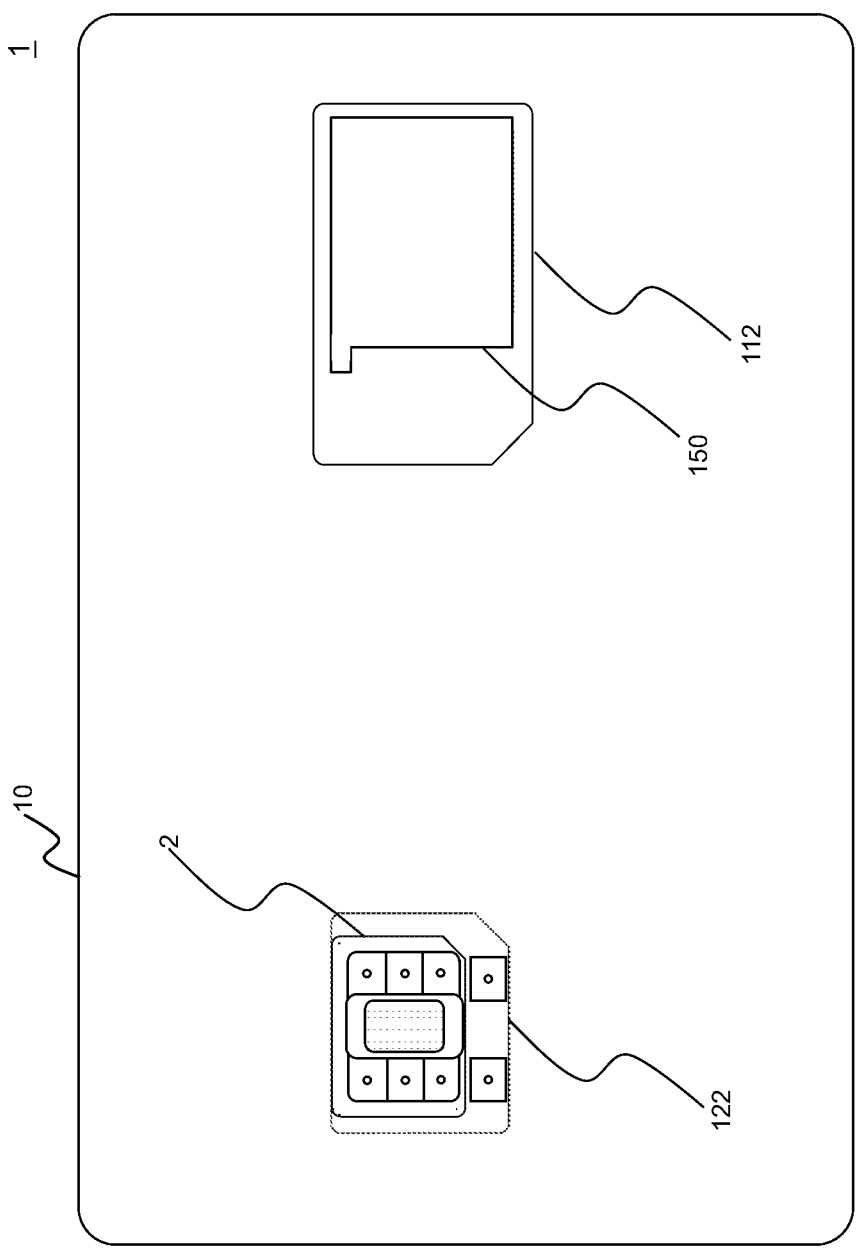
FIG. 6 is a top view of the auxiliary mounting structure mounted with an advanced smart card.
Figure 7:
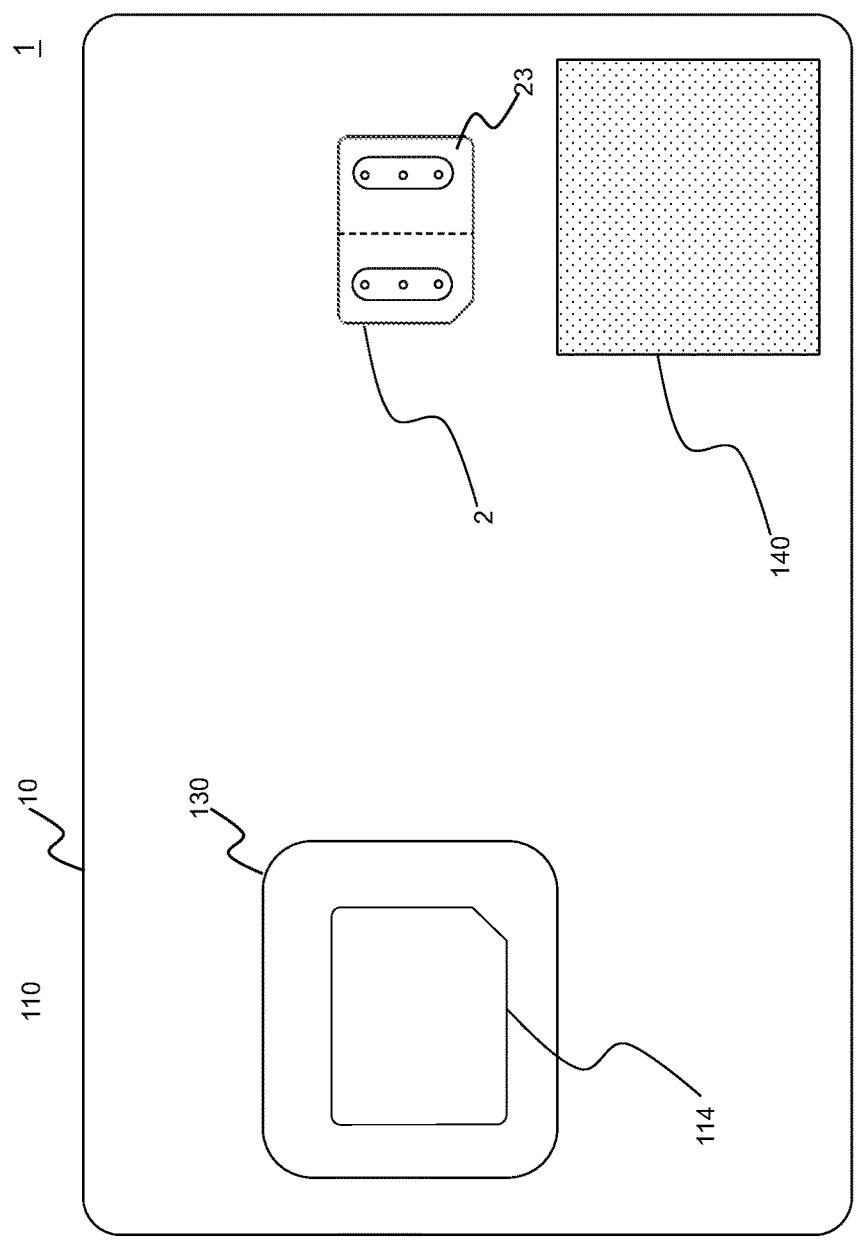
FIG. 7 is a bottom view of the auxiliary mounting structure mounted with the advanced smart card.

Please see FIG. 6. The auxiliary mounting structure 1 and the advanced smart card 2 are better to bundle for sale. Therefore, the advanced smart card 2 will be placed in the third removed region 122 as mentioned above. Since the plastic film 130 is under a unprotected status, it is easily to adhere dusts in the air, further losing stickiness of the glue. When the auxiliary mounting structure 1 and the advanced smart card 2 are sold, it is better to cover a release paper 150 over a portion of the plastic film 130 exposed out of the second removed region 114. Please see FIG. 7. FIG. 7 is a bottom view of the auxiliary mounting structure 1 mounted with the advanced smart card 2. The exposed portion of the advanced smart card 2 on the right is the release paper 23. The release paper 23 is easily separated from the advanced smart card 2 by external forces. A better solution to settle the problem is to add a sheet over the release paper 23 for protection. If the auxiliary mounting structure 1 uses cardboards as the material, the sheet can be an extension of the outermost layer of the cardboards. By using a tear line, the sheet is removably connected to the auxiliary mounting structure 1. At this moment, the advanced smart card 2 is attached to the auxiliary mounting structure 1 by the portion glued outside the release paper 23.

Figure 8:
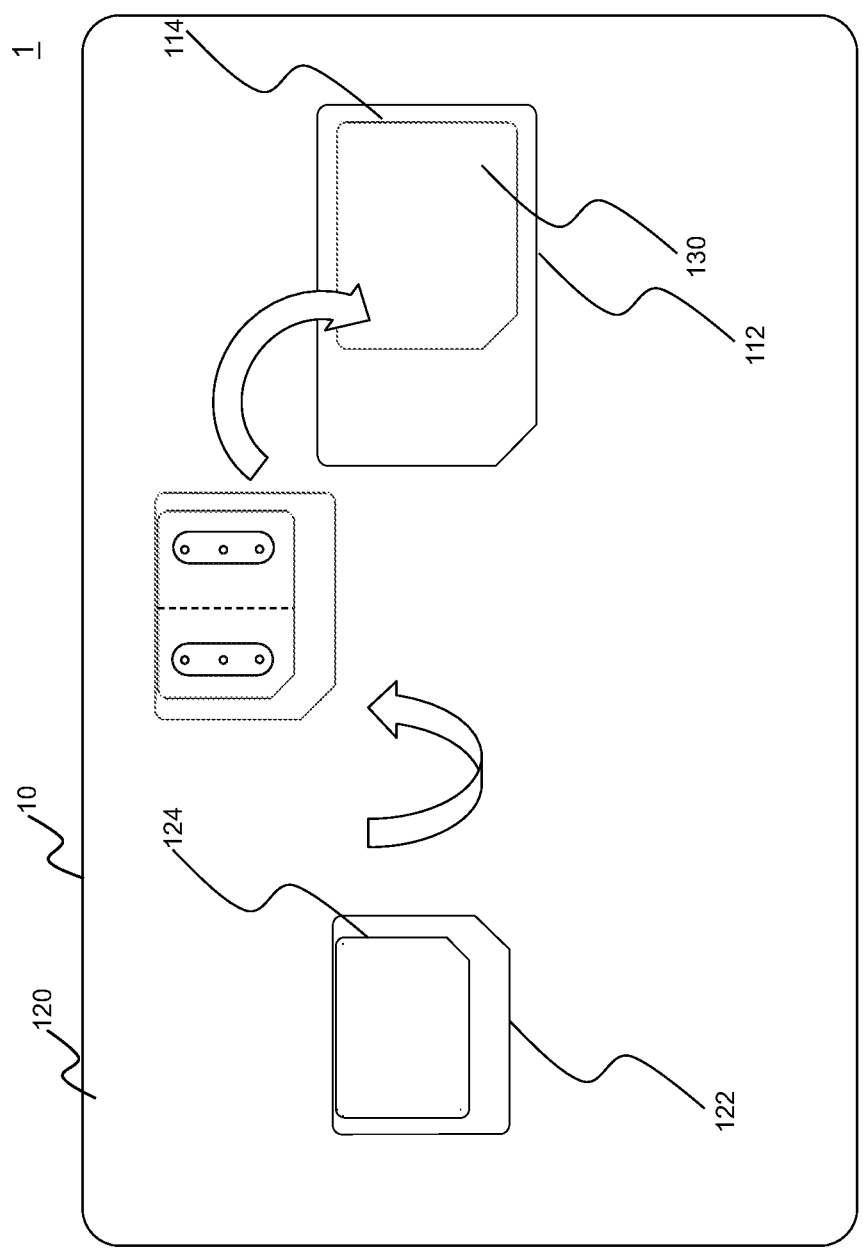
FIG. 8 shows steps for using the auxiliary mounting structure.
Figure 9:
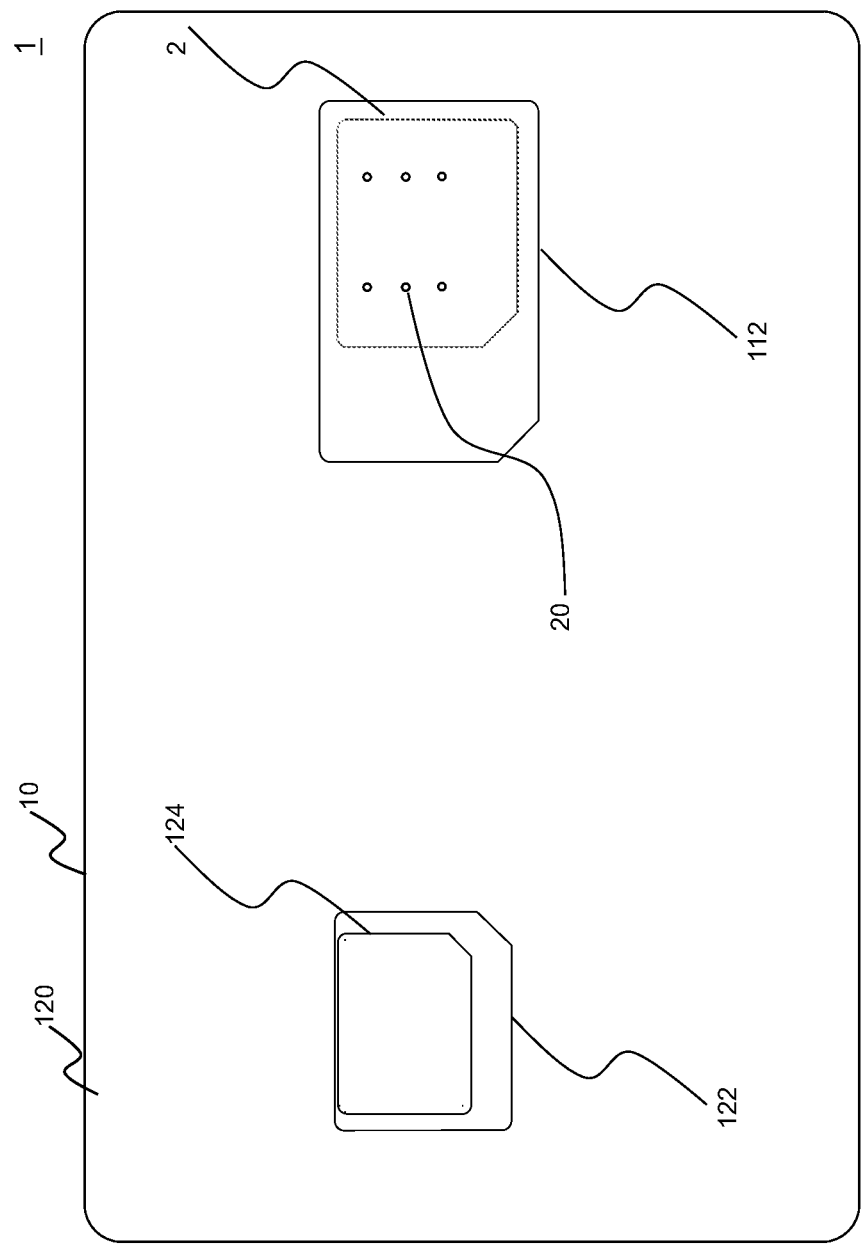
FIG. 9 shows another step for using the auxiliary mounting structure.
Figure 10:
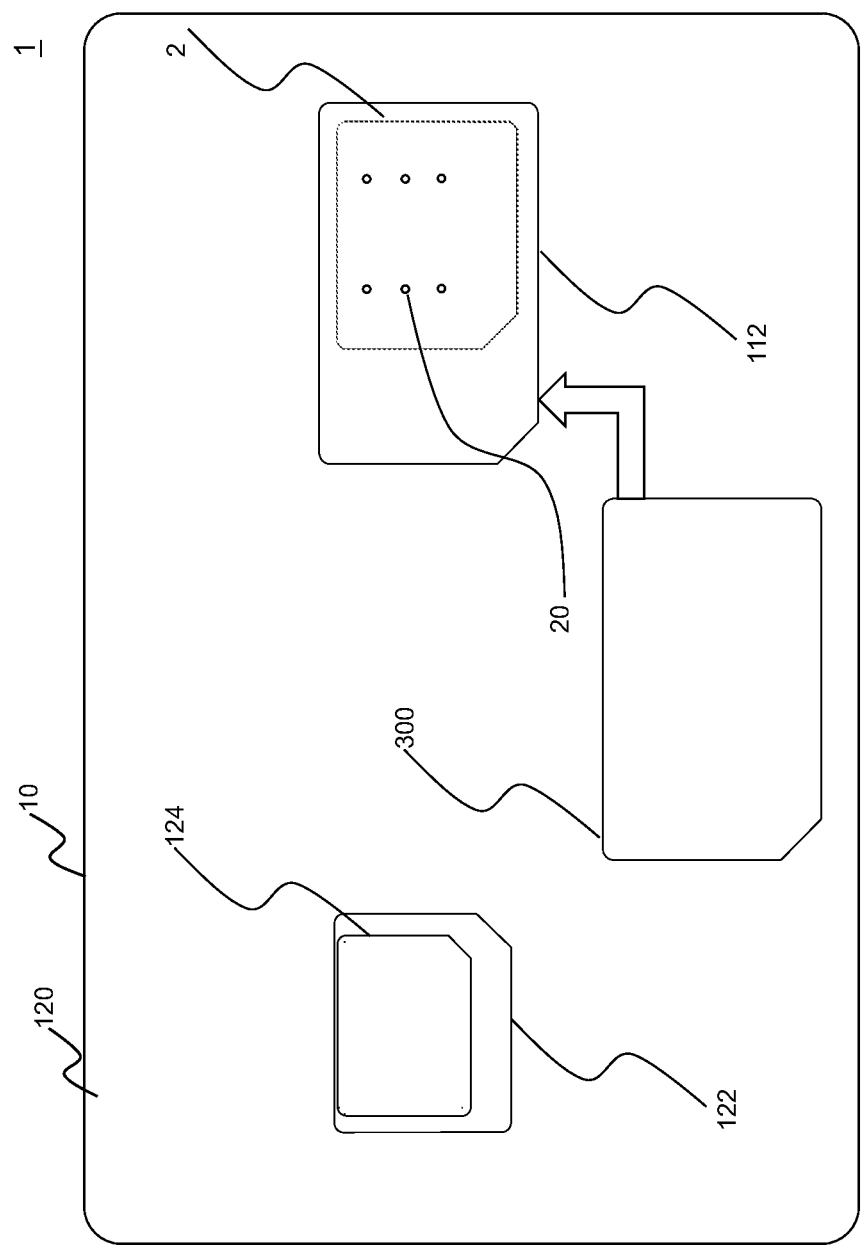
FIG. 10 illustrates mounting the advanced smart card onto a mini-SIM card.

Before the auxiliary mounting structure 1 is used to combine the advanced smart card 2 and any SIM card, there are several front steps. Please see FIG. 8 and FIG. 9. As shown in FIG. 8, a first front step is to tearing off the release paper 150. Then, remove the advanced smart card 2, turn it over and temporarily attach the advanced smart card 2 to the plastic film 130 with a side having the contacts 25 facing down by the glue. Next, as shown in FIG. 9, tear off the release paper 23. Now, glue on the peripheries of the smart card contacts 20 is exposed (the glue on the advanced smart card 2 is stickier than that on the plastic film 130; the glue on the advanced smart card 2 can effectively attach the advanced smart card 2 onto an object). Please see FIG. 10. If it is planned to attach the advanced smart card 2 to a mini-SIM card 300, take the mini-SIM card 300 with a side of contacts facing down. Put the mini-SIM card 300 in the first removed region 112 to finish the procedure. Since the relative position of the first removed region 112 and the second removed region 114 is specially designed, it causes each smart card contact 20 of the advanced smart card 2 to contact a corresponding contact of the mini-SIM card 300 without error contact or displacement. For the SIM card slots of some mobile phones, the total thickness of the advanced smart card 2 and the mini-SIM card 300 is too thick to insert. Now, the sandpaper 140 one the back side can be torn off. With fixture of the mini-SIM card 300 by the first removed region 112, the back of the mini-SIM card 300 is repeatedly rubbed by the sandpaper 140 until the total thickness of the mini-SIM card 300 and the advanced smart card 2 gets thinner and the combination can be inserted into the SIM card slot.

Figure 11:
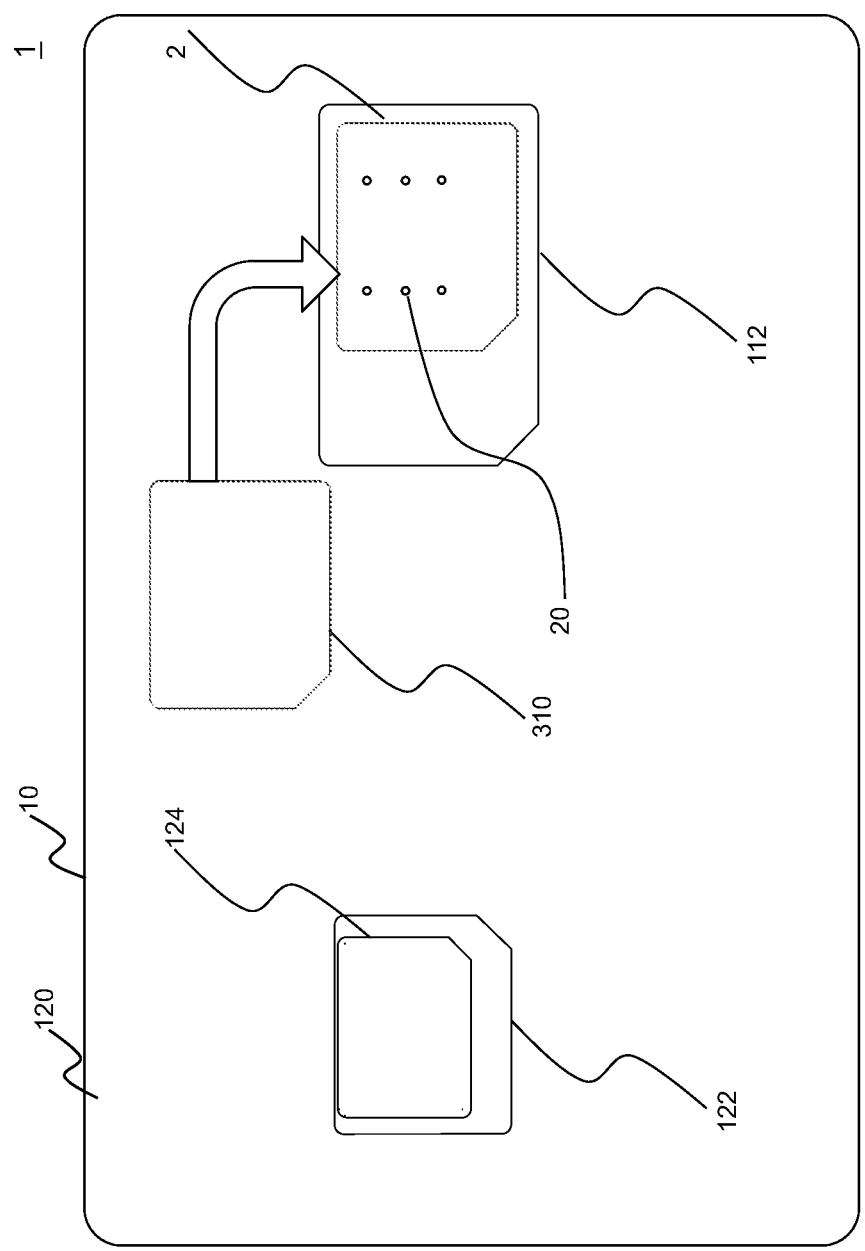
FIG. 11 illustrates mounting the advanced smart card onto a micro-SIM card.

Please see FIG. 11. If it is planned to attach the advanced smart card 2 to a micro-SIM card 310, just place micro-SIM card 310 with a side of contacts facing down to the second removed region 114. Now, a depth of the second removed region 114 should accommodate the thickness of the advanced smart card 2 and partial thickness of the micro-SIM card 310. The plastic film 130 is flexible. A limited pressure exerted on the advanced smart card 2 to partially remove the advanced smart card 2 out of the second removed region 114. Thus, more portions of the micro-SIM card 310 can be accommodated in the second removed region 114. Of course, each smart card contact 20 of the advanced smart card 2 and each contact of the micro-SIM card 310 are correspondingly designed. When the advanced smart card 2 and the micro-SIM card 310 are attached, each smart card contact 20 contacts one corresponding contact of the micro-SIM card 310 without error contact or displacement. Similarly, the torn off sandpaper 140 can also be used to rub down partial thickness of the micro-SIM card 310, in case a total thickness of the micro-SIM card 310 and the advanced smart card 2 is too thick so that the combination is not able to be inserted to the SIM card slot.

Figure 12:
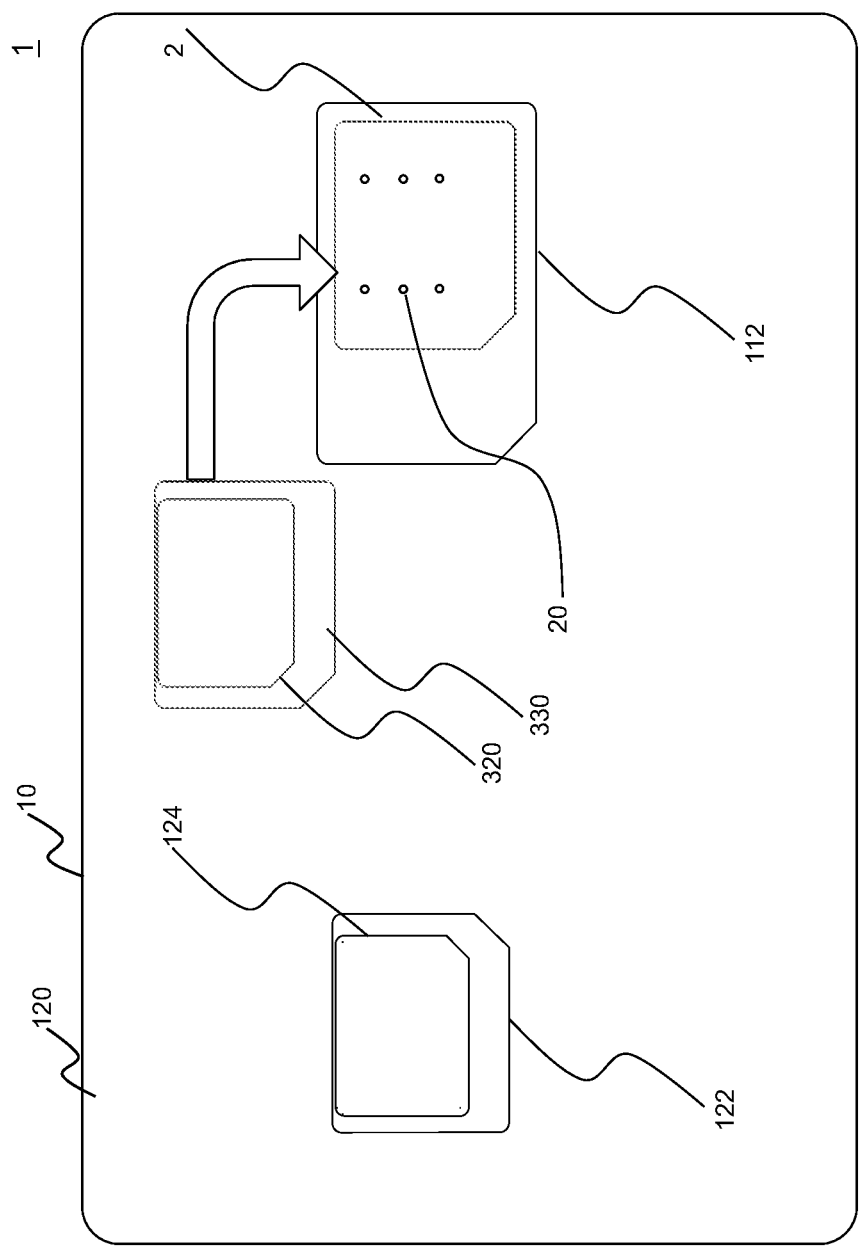
FIG. 12 illustrates mounting the advanced smart card onto a nano-SIM card.

Please see FIG. 12. If it is planned to attach the advanced smart card 2 and a nano-SIM card 320, face down the side of the nano-SIM card 320 having contacts and place the nano-SIM card 320 with the fixing structure 330 (generally, when an nano-SIM card is for sale, there is usually a fixing structure which can be placed around the nano-SIM card; the whole appearance of the nano-SIM card and the fixing structure looks like the appearance of a micro-SIM card; requirement of being an nano-SIM card or a micro-SIM card for different mobile phones is available) around the nano-SIM card 320 in the second removed region 114. At this moment, depth of the second removed region 114 should accommodate the thickness of the advanced smart card 2 and partial thickness of the fixing structure 330. Of course, a location of each smart card contact 20 of the advanced smart card 2 and a location of each contact of the nano-SIM card 320 are corresponding due to the existence of the fixing structure 330. So when the advanced smart card 2 and the nano-SIM card 320 are attached, each smart card contact 20 contacts corresponding contact of the nano-SIM card 320 without error contact or displacement. Similarly, the torn off sandpaper 140 can be used to rub down partial thickness of the nano-SIM card 320 (the fixing structure 330 has been removed when use), in case a total thickness of the nano-SIM card 320 and the advanced smart card 2 is too thick and the combination can not be inserted into the SIM card slot.

Figure 13:
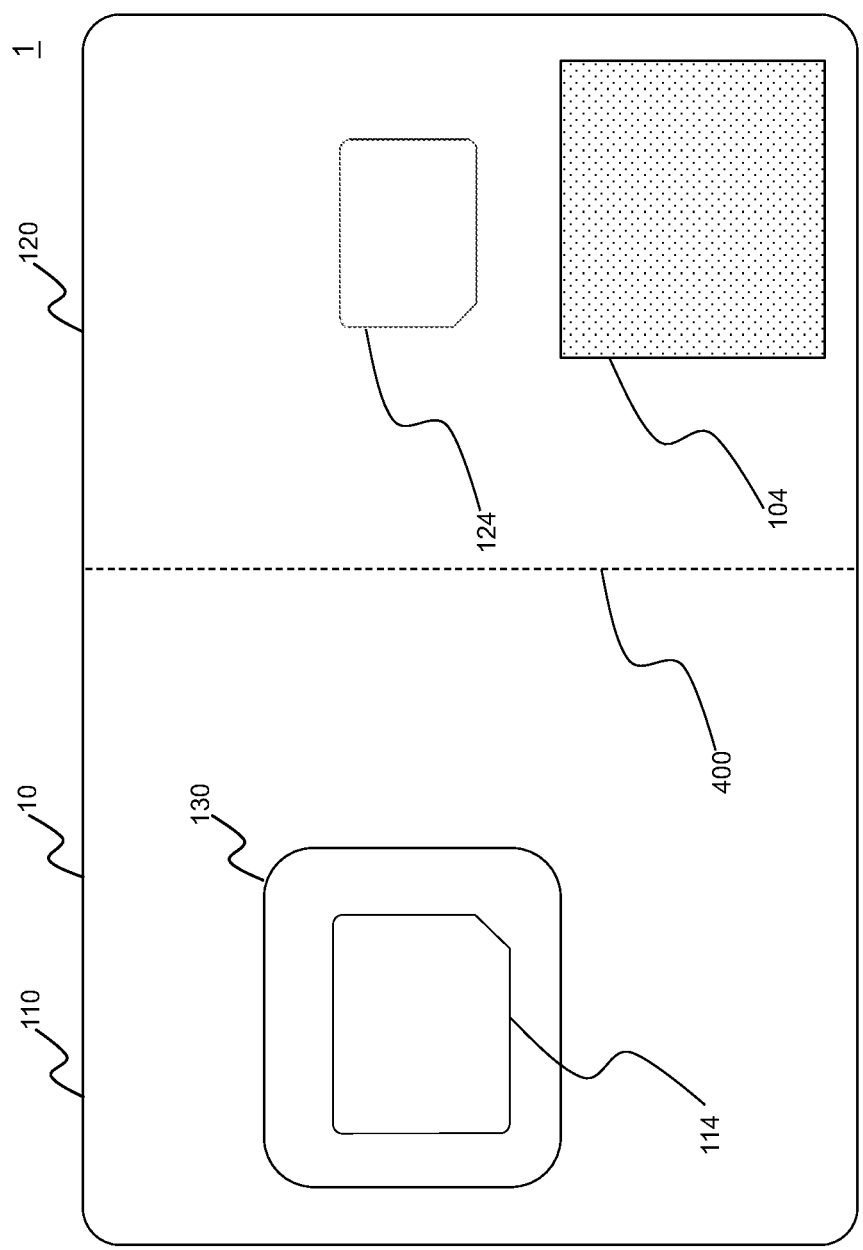
FIG. 13 is a bottom view of another auxiliary mounting structure according to the present invention.

In another embodiment, tear-off method applied to the sandpaper 40 can be specially designed for a user-friendly use. Please see FIG. 13. A tear line 400 can be formed on the board 10. When a user tear off the auxiliary mounting structure 1 along the tear line 400, the sandpaper 40 can be separated from the auxiliary mounting structure 1.

Figure 14:
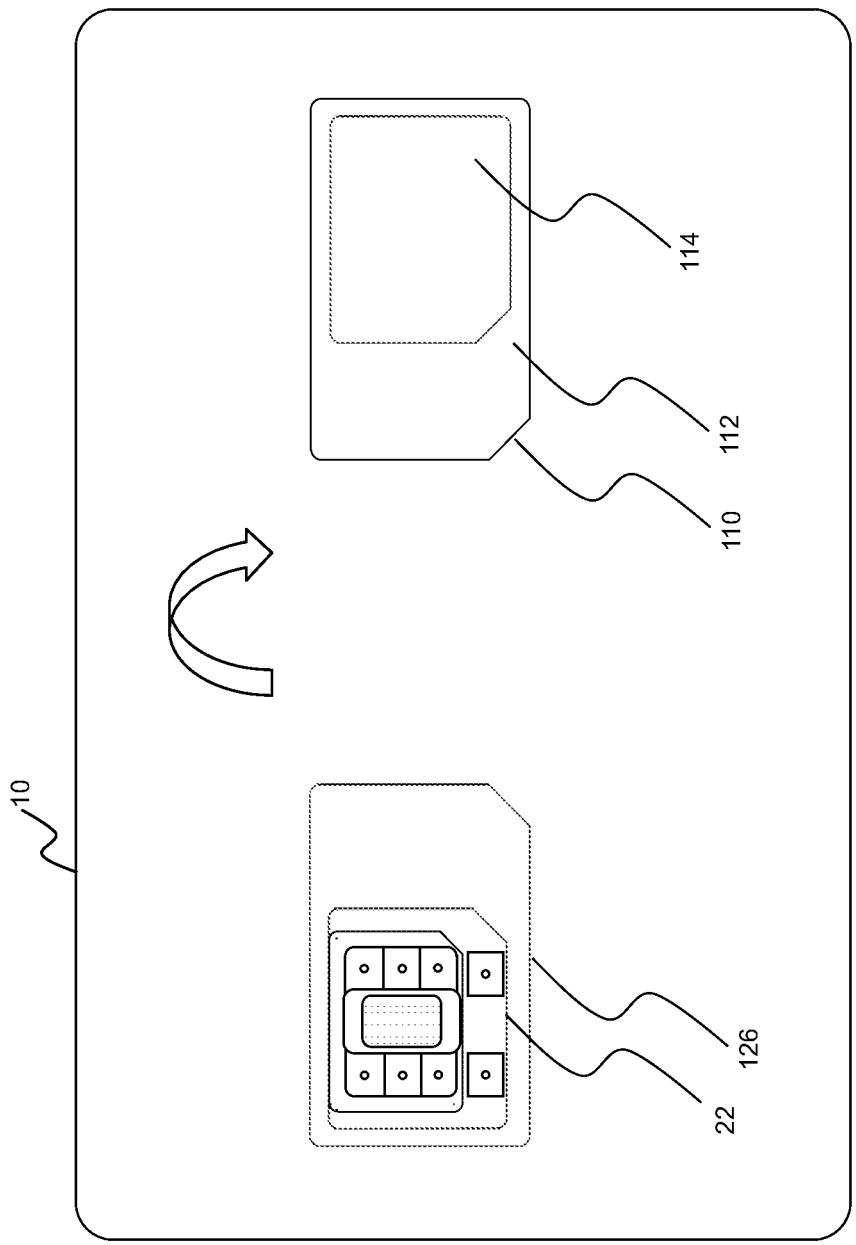
FIG. 14 is a top view of still another auxiliary mounting structure according to the present invention.

In still another embodiment, in order to facilitate placing the advanced smart card 2 into the second removed region 114, the second accommodating portion 120 is included in a cut-off body 126 having a shape substantially equal to that of a first type SIM card. The cut-off body 126 can be removed from the auxiliary mounting structure 1. Please see FIG. 14. First, tear off the release paper 150. After the cut-off body 126 and the advanced smart card 2 are removed from the auxiliary mounting structure 1, turn over the cut-off body 126 with the advanced smart card 2 and place them directly to the first removed region 112. Because relative location of the advanced smart card 2 and the cut-off body 126 are pre-designed, at this moment, the advanced smart card 2 faces the second removed region 114. Directly press down the advanced smart card 2 from the cut-off body 126. The advanced smart card 2 can be placed into the second removed region 114.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An auxiliary mounting structure, formed by a board, for mounting an advanced smart card which has a contact side with a plurality of smart card contacts, onto a Subscriber Identity Module (SIM) card, comprising:
    a first accommodating portion, comprising:
        a first removed region, having a shape substantially equal to that of a first type SIM card; and
        a second removed region, formed below the first removed region and penetrating the board, having a shape substantially equal to that of a second type SIM card;
    a second accommodating portion, comprising:
        a third removed region, having a shape substantially equal to that of the second type SIM card, for placing the advanced smart card; and
        a fourth removed region, formed below the third removed region and penetrating the board, having a shape substantially equal to that of a third type SIM card;
    a plastic film, glued on a gluing side, attached underneath the first removed region, for removably attaching the advanced smart card when the advanced smart card is placed in the second removed region; and
    a sandpaper, installed on the board, for rubbing down partial thickness of the SIM card attached to the advanced smart card,
    wherein a shape of the advanced smart card is substantially the same as that of the second type SIM card.

2. The auxiliary mounting structure according to claim 1, wherein the board is made of cardboards, plastic, carbon fiber, or metal.

3. The auxiliary mounting structure according to claim 1, wherein the second accommodating portion is included in a cut-off body having a shape substantially equal to that of a first type SIM card, capable of being removed from the auxiliary mounting structure.

4. The auxiliary mounting structure according to claim 1, wherein the first type SIM card is a mini-SIM card (2FF).

5. The auxiliary mounting structure according to claim 1, wherein the second type SIM card is a micro-SIM card (3FF).

6. The auxiliary mounting structure according to claim 1, wherein the third type SIM card is a nano-SIM card (4FF).

7. The auxiliary mounting structure according to claim 1, wherein the plastic film is made by Poly Ethylene (PE), Poly Vinyl Chloride (PVC) or Poly Ethylene Terephthalate (PET).

8. The auxiliary mounting structure according to claim 1, wherein the advanced smart card has a flexible printed circuit board having the smart card contacts on the contact side and an integrated circuit.

9. The auxiliary mounting structure according to claim 1, wherein the advanced smart card has a layer of glue around the smart card contacts that is covered by a release paper.

10. The auxiliary mounting structure according to claim 1, wherein a portion of the plastic film which is exposed out of the second removed region is covered by a release paper.

11. The auxiliary mounting structure according to claim 1, wherein the board has a tear line so that when the auxiliary mounting structure is torn along the tear line, the sandpaper is separated from the auxiliary mounting structure.

* * * * *